(12) United States Patent
Ryu

(10) Patent No.: US 7,183,173 B2
(45) Date of Patent: Feb. 27, 2007

(54) METHOD FOR FORMING ISOLATION FILM IN SEMICONDUCTOR DEVICE

(75) Inventor: Choon Kun Ryu, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 14 days.

(21) Appl. No.: 11/020,330

(22) Filed: Dec. 22, 2004

(65) Prior Publication Data

US 2006/0094201 A1    May 4, 2006

(30) Foreign Application Priority Data

Oct. 29, 2004    (KR)    ............ 10-2004-0087145

(51) Int. Cl.
H01L 21/76    (2006.01)

(52) U.S. Cl. ............................. 438/424; 438/443
(58) Field of Classification Search ........ 438/424–425, 438/439, 443–445
See application file for complete search history.

(56) References Cited

U.S. PATENT DOCUMENTS

| 5,698,467 A | * | 12/1997 | Sakao et al. ............ 438/692 |
| 6,287,956 B2 | * | 9/2001 | Yokoyama et al. ...... 438/624 |
| 6,693,042 B1 | * | 2/2004 | Sedigh et al. ............ 438/714 |
| 2005/0167778 A1 | * | 8/2005 | Kim et al. ............... 257/510 |

FOREIGN PATENT DOCUMENTS

| JP | 2001-332510 | 11/2001 |
| KP | 10-2002-0092682 | 12/2002 |
| KP | 10-2004-0008727 | 1/2004 |

* cited by examiner

*Primary Examiner*—Theresa T. Doan
(74) *Attorney, Agent, or Firm*—Marshall, Gerstein & Borun LLP

(57) ABSTRACT

A method for forming an isolation film of a semiconductor device is disclosed which includes forming trenches in a semiconductor substrate, forming a first HDP oxide film in the formed trenches, performing an etch-back process using a mixing gas of $C_2F_6$ gas and $O_2$ gas to form vertical walls in the first HDP oxide films and forming a second HDP oxide film on the resulting structure. The characteristics of a device can be improved because diffusion of F ions in a FSG film formed on the first HDP oxide film is minimized.

7 Claims, 3 Drawing Sheets

METHOD FOR FORMING ISOLATION FILM IN SEMICONDUCTOR DEVICE

BACKGROUND

1. Technical Field

A method for forming an isolation film in a semiconductor device is shown and described.

2. Description of the Related Art

Recently, with the higher-integration and higher-density of semiconductor devices, technologies which can improve the gap-fill characteristics of isolation films has become increasingly important.

Generally, a typical method for forming an isolation film in a semiconductor device includes forming a first insulating film in pre-existing trenches, performing an etch-back process and then forming a second insulating film to fill the trenches.

However, if the etch-back process is performed using a process gas such as $C_2F_6$ gas that contains F ions, a in the etch-back process, a FSG (Fluorinated Silicon Glass) film is formed on a first high-density plasma (HDP) oxide film. The F ions in the FSG film are diffused into the interface between the isolation film and elements while undergoing subsequent treatment processes, etc. Therefore, there is a problem in that the F ions of the FSG film degrade the characteristics of the resulting device.

SUMMARY OF THE DISCLOSURE

Accordingly, in view of the above problems, a method for forming an isolation film in a semiconductor device is disclosed in which the F ions, that can be diffused into the interface between the isolation film and the trench or between layers of the isolation film in an isolation film formation process, are prevented from degrading the characteristics of the resulting device.

One disclosed method for forming an isolation film of a semiconductor device comprises (a) forming trenches in a semiconductor substrate, (b) forming a first HDP oxide film in the formed trenches, (c) performing an etch-back process using a mixing gas of $C_2F_6$ gas and $O_2$ gas to prevent diffusion of F ions an FSG film formed on the first HDP oxide film and to form the first HDP oxide film having a vertical sidewall on the resulting entire surface in which the first HDP oxide film is formed, and (d) performing a second HDP oxide film on the resulting entire surface on which the etch-back process is completed.

Preferably, the etch-back process using the mixing gas of $C_2F_6$ gas and $O_2$ gas is performed under the process condition in which $C_2F_6$ gas is supplied at a flow rate of about 50 to 200 sccm, $O_2$ gas is supplied at a flow rate of about 200 to 500 sccm, the HF power is about 500 to 1000 W and the LF power is about 3000 to 4000 W. The method preferably further comprises forming sidewall oxide films on the sidewalls of the trenches by means of an oxidization process, after the trenches are formed preferably, before the first HDP oxide film is formed.

Preferably, the first HDP oxide film is formed under the process condition in which a $SiH_4$ gas flow is about 10 to 100 sccm, an $O_2$ gas flow is about 10 to 100 sccm, a He gas flow is about 100 to 1000 sccm, a $H_2$ gas flow is 50 to 1000 sccm, the LF power is about 1000 to 10000 W, and the HF power is about 500 to 5000 W. The second HDP oxide film is preferably formed in the same process condition as those of the first HDP oxide film.

Preferably, the method further comprises the step of forming an isolation film so that the first HDP oxide film and the second HDP oxide film are disposed only in the trenches by performing a polishing process until the semiconductor substrate is exposed, after the second HDP oxide film is formed.

Another disclosed method comprises (a) forming trenches in a semiconductor substrate, (b) forming sidewall oxide films on the sidewalls of the trenches, (c) forming a first HDP oxide film in the trenches having the sidewall oxide films, (d) performing an etch-back process using a mixing gas of $C_2F_6$ gas and $O_2$ to prevent diffusion of F ions of an FSG film formed on the first HDP oxide film and form the first HDP oxide film having a vertical sidewall on the resulting entire surface in which the first HDP oxide film is formed, (e) performing a second HDP oxide film on the resulting entire surface on which the etch-back process is completed, and (f) forming an isolation film on the resulting surface so that the first HDP oxide film and the second HDP oxide film are disposed only in the trenches, by performing a polishing process until the semiconductor substrate is exposed.

DETAILED DESCRIPTION OF PREFERRED EMBODIMENTS

Figure 1A:
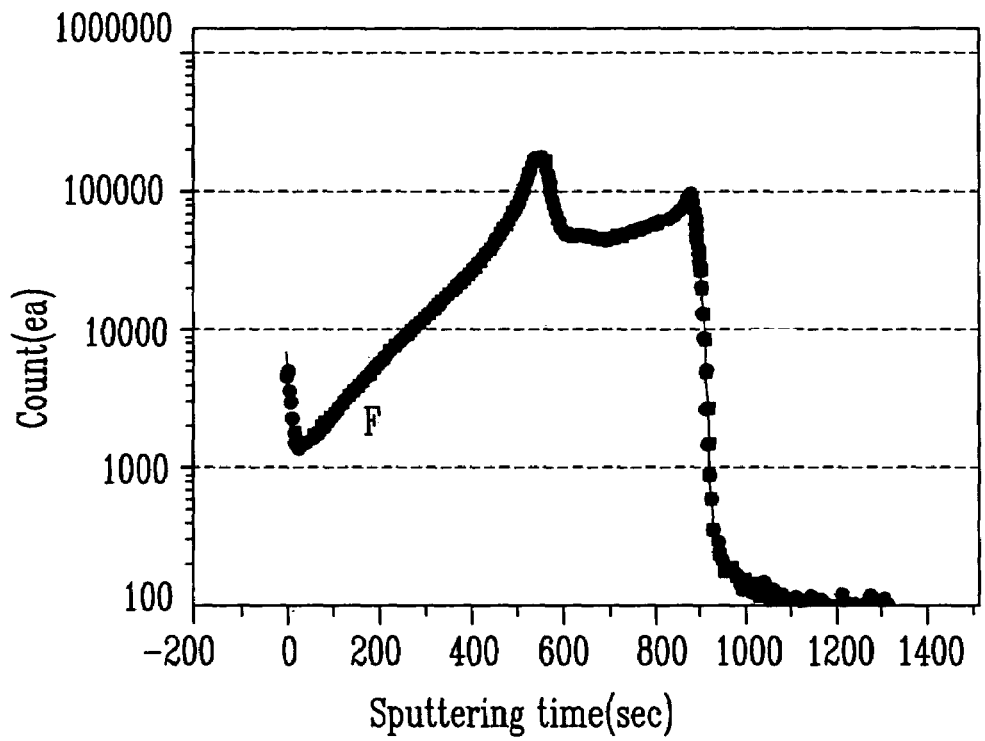
FIGS. 1A and 1B are graphs showing a SIMS profile of the concentration of F ions in the isolation film formed according to a prior art.

Now the preferred embodiments will be described with reference to the accompanying drawings. Since the preferred embodiments are provided for the purpose of conveying an understanding to those of ordinary skill in the art, they may be modified and therefore the scope of this disclosure is not limited by the preferred embodiments described herein. Meanwhile, in case where it is described that one film is "on" another film or "on" a semiconductor substrate, the one film may directly or indirectly contact the other film or the semiconductor substrate. Or, a third film may be disposed between the one film and the other film or the semiconductor substrate. Further, in the drawing, the thickness and size of each layer or film may be exaggerated for convenience of explanation and clarity. Like reference numerals are used to identify the same or similar parts.

Figure 1B:
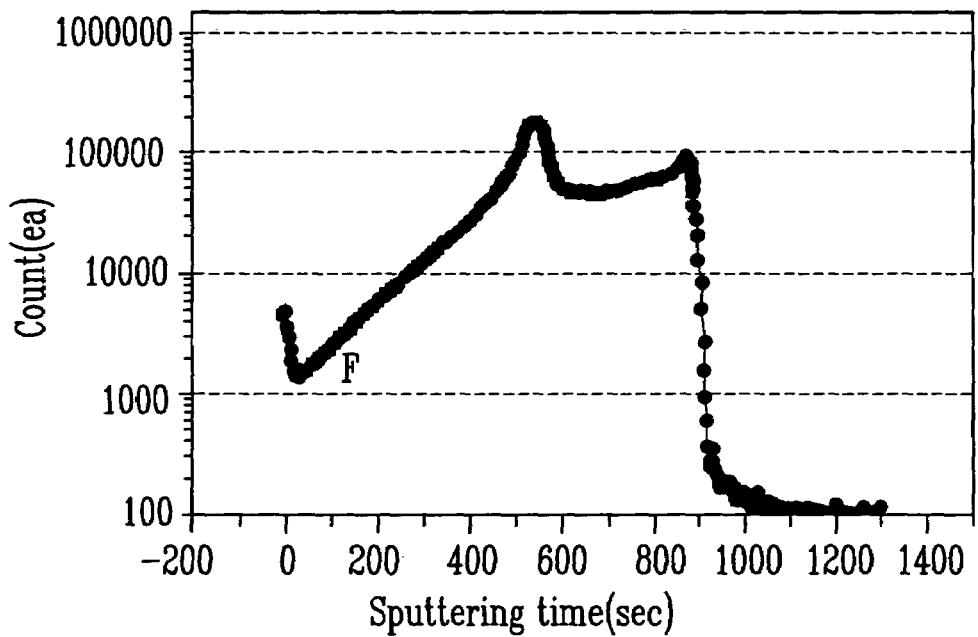
Figure 2:
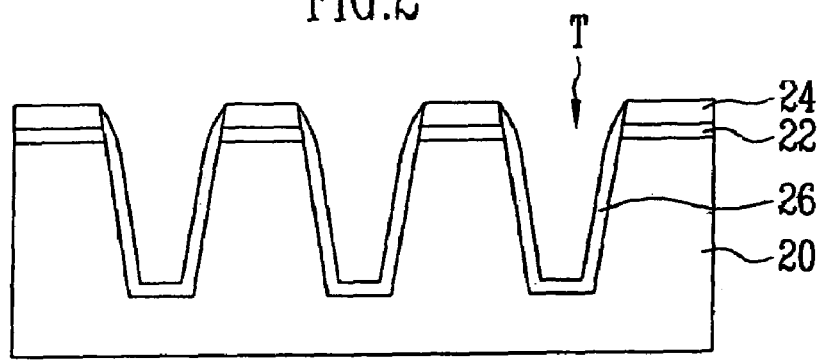
FIGS. 2 to 4 are cross-sectional views for explaining a disclosed method for forming an isolation film in a semiconductor device.
Figure 3:
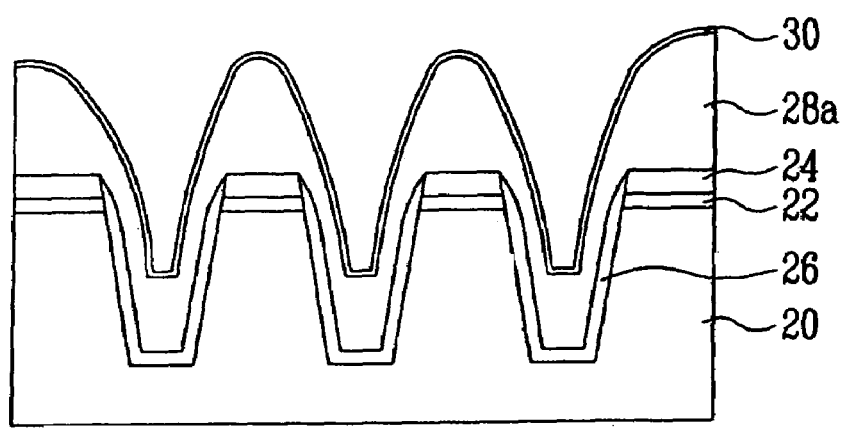
Figure 4:
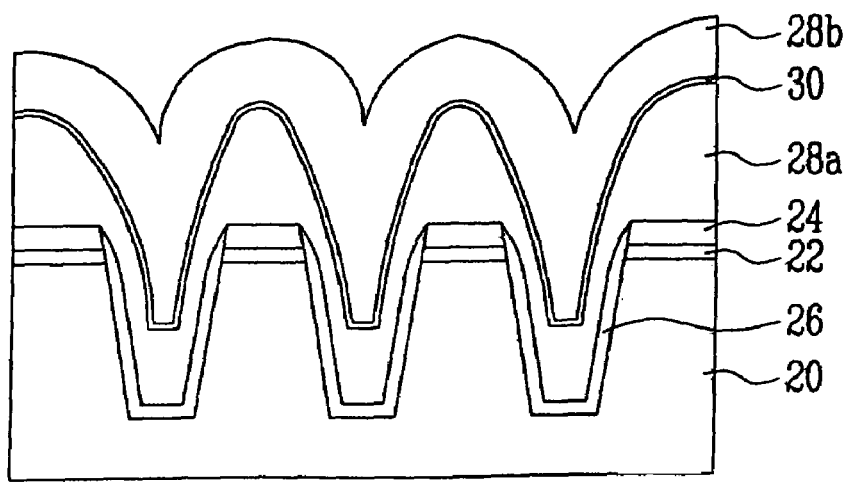
Figure 5A:
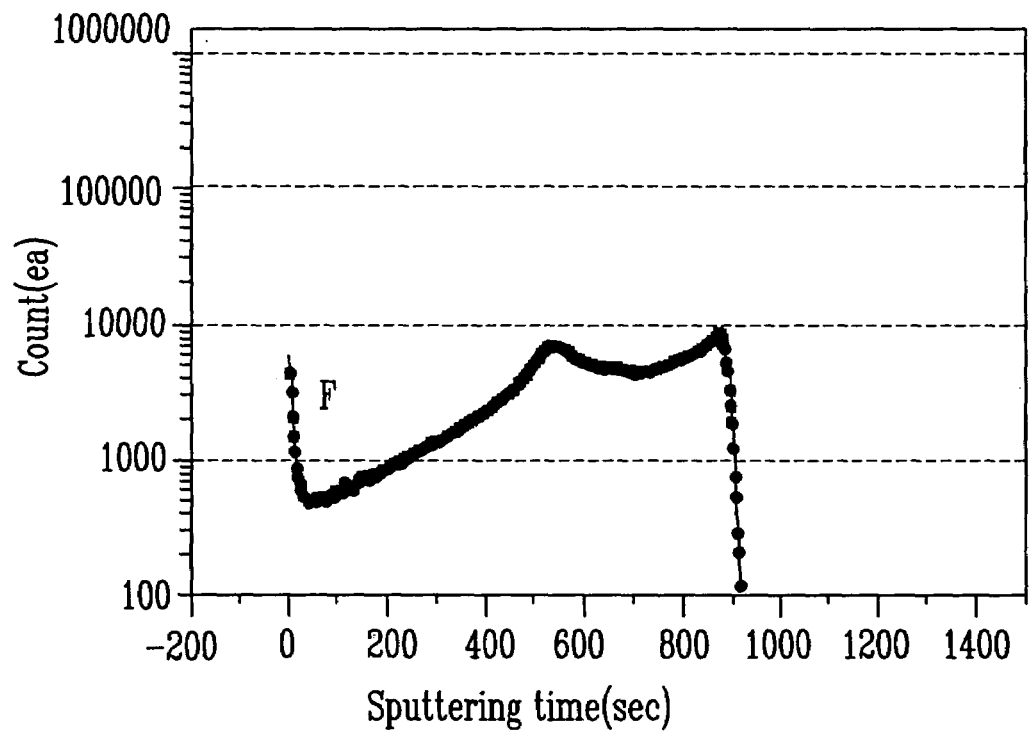
FIGS. 5A and 5B are graphs showing a SIMS profile of the concentration of F ions in the isolation film formed according to the disclosed methodology.
Figure 5B:
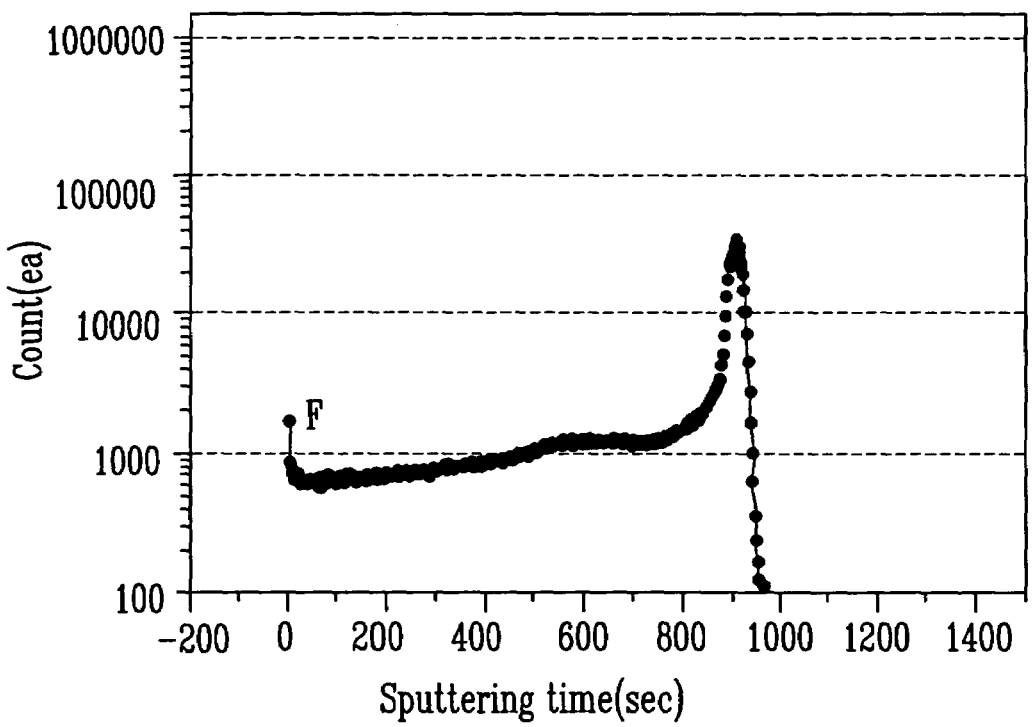

FIGS. 1A and 1B are graphs showing a SIMS profile of the concentration of F ions in the isolation film formed according to the prior art. FIGS. 2 to 4 are cross-sectional views for explaining a disclosed method for forming an isolation film in a semiconductor device. FIGS. 5A and 5B are graphs showing a SIMS profile of the concentration of F ions in the isolation film formed according to the disclosed methods.

Referring to FIG. 2, a pad nitride film 22 and a pad oxide film 24 are sequentially formed on a semiconductor substrate 20. A photoresist pattern (not shown) that defines the isolation region is formed on a predetermined region of the pad oxide film 24. An etch process is then performed using the photoresist pattern (not shown) as an etch mask, thus forming trenches T in the pad oxide film 24, the pad nitride film 22 and the semiconductor substrate 20 at a given depth. Thereafter, an oxidization process is performed to form sidewall oxide films 26 on the sidewalls of the formed trenches T.

Referring to FIG. 3, a first high density plasma (HDP) oxide film 28a is formed on the entire surface including the sidewall oxide films 26.

The first HDP oxide film 28a is formed under the process condition in which a $SiH_4$ gas flow is about 10 to 100 sccm, an $O_2$ gas flow is about 10 to 100 sccm, a He gas flow is about 100 to 1000 sccm, a $H_2$ gas flow is 50 to 1000 sccm, the LF power is about 1000 to 10000 W, and the HF power is about 500 to 5000 W.

After the first HDP oxide film 28a is formed, an etch-back process is performed on the resulting structure. As shown in FIG. 3, the first HDP oxide film 28a is formed to have a vertical sidewall so that a void formed that may block the inlet of the trench is prevented because an overhang is generated in the first HDP oxide film 28a on which the etch-back process is carried out.

In this time, the etch-back process is performed using a mixture of $C_2F_6$ gas and $O_2$ gas.

Furthermore, the etch-back process is performed under a process condition in which a $C_2F_6$ gas flow is about 50 to 200 sccm, an $O_2$ gas flow is about 200 to 500 sccm, the HF power is about 500 to 1000 W and the LF power is about 3000 to 4000 W.

In the prior art, if the etch-back process is performed using the process gas such as $C_2F_6$ gas containing F ions, the FSG film 30 is formed on the first HDP oxide film 28a. The F ions of this film are diffused into the interface between the isolation film and the elements, while undergoing a subsequent treatment process, and degrade the characteristics of the resulting device.

In the invention, however, if the etch-back process is performed using a mixture of $C_2F_6$ gas and $O_2$ gas, a chemico-physical etch-back process in which a physical etch-back process using $O_2$ and a chemical etch-back process using F are mixed is performed. Diffusion of the F ions of the FSG film 30 formed on the first HDP oxide film 28a can be minimized accordingly.

Upon formation of an isolation film that separates elements in next-generation nano-semiconductor devices, the isolation film can be gap-filled through a deposition-etch-back-deposition process. At this time, the problem of doping due to diffusion of F ions can be solved using existing equipment without using additional new equipment. More particularly, in the case of a flash device used for a high voltage for device operation, the problem of doping due to diffusion of F ions can cause serious degradation of a device characteristic. Therefore, the problem of doping due to diffusion of F ions is solved by this disclosure and the reliability of next-generation flash devices is significantly improved.

Referring to FIG. 4, a second HDP oxide film 28b is formed on the resulting entire surface including the first HDP oxide film 28a on which the etch-back process is completed and which has the vertical sidewall, thus completely gap-filling the trenches.

Though not shown in the drawings, formation of the isolation film is completed so that the first HDP oxide film 28a and the second HDP oxide film 28b are disposed only in the trenches, by performing a polishing process until the semiconductor substrate 20 is exposed on the resulting surface in which the second HDP oxide film 28b is formed.

The second HDP oxide film 28b is formed in the same process condition as those that is performed when the first HDP oxide film is formed.

FIGS. 1A and 1B are graphs showing a SIMS profile of the concentration of F ions in the isolation film formed according to the prior art.

FIG. 1A shows a SIMS profile after the chemical etch-back using F is performed, and FIG. 1B shows a SIMS profile after a thermal treatment process of a subsequent process is performed.

FIG. 5A shows a SIMS profile after a chemico-physical etch-back process in which a physical etch-back process using $O_2$ and a chemical etch-back process using F are mixed is performed, and FIG. 5B shows a SIMS profile after a thermal treatment process of a subsequent process is performed.

From the drawings, it can be seen that FIGS. 1A and 1B have a high degree of diffusion in F ions, but FIGS. 5A and 5B have a low degree of diffusion in F ions compared to those in FIGS. 1A and 1B.

According to the disclosed methods, by performing the chemico-physical etch-back process in which the physical etch-back process using $O_2$ and the chemical etch-back process using F are mixed, there is an effect in that characteristics of a device can be improved since diffusion of F ions in the FSG film formed on the first HDP oxide film is minimized.

As described above, by performing the chemico-physical etch-back process in which the physical etch-back process using $O_2$ and the chemical etch-back process using F are mixed, there is an effect in that characteristics of a device can be improved since diffusion of F ions in the FSG film formed on the first HDP oxide film is minimized.

Although the foregoing description has been made with reference to the preferred embodiments, it is to be understood that changes and modifications may be made by the ordinary skilled in the art without departing from the spirit and scope of the appended claims.

What is claimed is:

1. A method for forming an isolation film of a semiconductor device, comprising:

forming a trench in a semiconductor substrate;

forming a first HDP oxide film in the formed trench;

performing an etch-back process using a mixture of $C_2F_6$ gas and $O_2$ gas to prevent diffusion of F ions of an FSG formed on the first HDP oxide film and to form a vertical sidewall in the first HDP oxide film; and forming a second HDP oxide film on the resulting structure.

2. The method as claimed in claim 1, comprising performing the etch-back process under process condition wherein a $C^2F_6$ gas flow is about 50 sccm to 200 sccm, an $O_2$ gas flow is about 200 sccm to 500 sccm, a HF power is about 500 W to 1000 W and an LF power is about 3000 W to 4000 W.

3. The method as claimed in claim 1, further comprising forming a sidewall oxide film on a sidewall of the trench by an oxidization process, after forming the trench.

4. The method as claimed in claim 1, comprising forming the first HDP oxide film under process conditions wherein an $SiH_4$ gas flow is about 10 sccm to 100 sccm, an $O_2$ gas flow is about 10 sccm to 100 sccm, an He gas flow is about 100 sccm to 1000 sccm, an $H_2$ gas flow is 50 sccm to 1000 sccm, an LF power is about 1000 W to 10000 W, and an HF power is about 500 to 5000 W.

5. The method as claimed in claim 1, comprising forming the second HDP oxide film using the process conditions as those of the first HDP oxide film.

6. The method as claimed in claim 1, further comprising performing a polishing process until the semiconductor substrate is exposed, after the second HDP oxide film is formed.

7. A method for forming an isolation film of a semiconductor device, comprising:
   forming a trench in a semiconductor substrate;
   forming a sidewall oxide film on a sidewall of the trench;
   forming a first HDP oxide film in the trench having the sidewall oxide films; performing an etch-back process using a mixture of $C^2F_6$ gas and $O_2$ gas to prevent diffusion of F ions of an FSG film formed on the first HDP oxide film and to form a vertical sidewall in the first HDP oxide film;
   forming a second HDP oxide film on the resulting structure; and
   performing a polishing process until the semiconductor substrate is exposed.

* * * * *